United States Patent
Zang et al.

(10) Patent No.: US 10,707,206 B2
(45) Date of Patent: Jul. 7, 2020

(54) GATE CUT ISOLATION FORMED AS LAYER AGAINST SIDEWALL OF DUMMY GATE MANDREL

(71) Applicant: GLOBALFOUNDRIES INC., Grand Cayman (KY)

(72) Inventors: Hui Zang, Guilderland, NY (US); Laertis Economikos, Wappingers Falls, NY (US); Ruilong Xie, Niskayuna, NY (US)

(73) Assignee: GLOBALFOUNDRIES INC., Grand Cayman, KY (US)

( * ) Notice: Subject to any disclaimer, the term of this patent is extended or adjusted under 35 U.S.C. 154(b) by 0 days.

(21) Appl. No.: 16/194,691

(22) Filed: Nov. 19, 2018

(65) Prior Publication Data

US 2020/0161296 A1 May 21, 2020

(51) Int. Cl.
*H01L 27/08* (2006.01)
*H01L 29/66* (2006.01)
(Continued)

(52) U.S. Cl.
CPC .... *H01L 27/0886* (2013.01); *H01L 21/28008* (2013.01); *H01L 21/30604* (2013.01); *H01L 21/31051* (2013.01); *H01L 21/31111* (2013.01); *H01L 21/31144* (2013.01); *H01L 21/76224* (2013.01); *H01L 29/0649* (2013.01);
(Continued)

(58) Field of Classification Search
CPC ... H01L 29/06; H01L 29/064; H01L 29/0649; H01L 29/66; H01L 29/665; H01L 29/6654; H01L 29/66454; H01L 29/6656; H01L 29/668; H01L 29/6681; H01L 29/78; H01L 29/784; H01L 29/7848; H01L 29/785; H01L 29/7851; H01L 27/08; H01L 27/088; H01L 27/0886; H01L 21/28; H01L 21/28; H01L 21/28; H01L 21/28008; H01L 21/30; H01L 21/306; H01L 21/306; H01L 21/30604; H01L 21/31; H01L 21/31; H01L 21/3105; H01L 21/31051; H01L 21/311; H01L 21/3111; H01L 21/31111; H01L 21/3114; H01L 21/3144; H01L 21/76;
(Continued)

(56) References Cited

U.S. PATENT DOCUMENTS

| | | | |
|---|---|---|---|
| 8,129,794 B2 * | 3/2012 | Hirase | H01L 29/517 257/369 |
| 2015/0303194 A1 * | 10/2015 | Lee | H01L 27/0886 257/392 |
| 2016/0190130 A1 | 6/2016 | Yu et al. | |

* cited by examiner

*Primary Examiner* — Monica D Harrison
(74) *Attorney, Agent, or Firm* — Francois Pagette; Hoffman Warnick LLC

(57) ABSTRACT

A method of forming a gate cut isolation, a related structure and IC are disclosed. The method forms a dummy gate material mandrel having a sidewall positioned between and spaced from a first active region covered by the mandrel and a second active region not covered by the mandrel. A gate cut dielectric layer is formed against the sidewall of the mandrel, and may be trimmed. A dummy gate material may deposited to encase the remaining gate cut dielectric layer. Subsequent dummy gate formation and replacement metal gate processing forms a gate conductor with the gate cut isolation electrically isolating respective first and second portions of the gate conductor. The method creates a very thin, slightly non-vertical gate cut isolation, and eliminates the need to define a gate cut critical dimension or fill a small gate cut opening.

17 Claims, 11 Drawing Sheets

(51) Int. Cl.
*H01L 27/088* (2006.01)
*H01L 29/06* (2006.01)
*H01L 29/78* (2006.01)
*H01L 21/762* (2006.01)
*H01L 21/28* (2006.01)
*H01L 21/306* (2006.01)
*H01L 21/3105* (2006.01)
*H01L 21/311* (2006.01)

(52) U.S. Cl.
CPC ...... *H01L 29/6656* (2013.01); *H01L 29/6681* (2013.01); *H01L 29/66545* (2013.01); *H01L 29/7848* (2013.01); *H01L 29/7851* (2013.01)

(58) Field of Classification Search
CPC ............... H01L 21/762; H01L 21/7622; H01L 21/76224
USPC .......................................................... 257/288
See application file for complete search history.

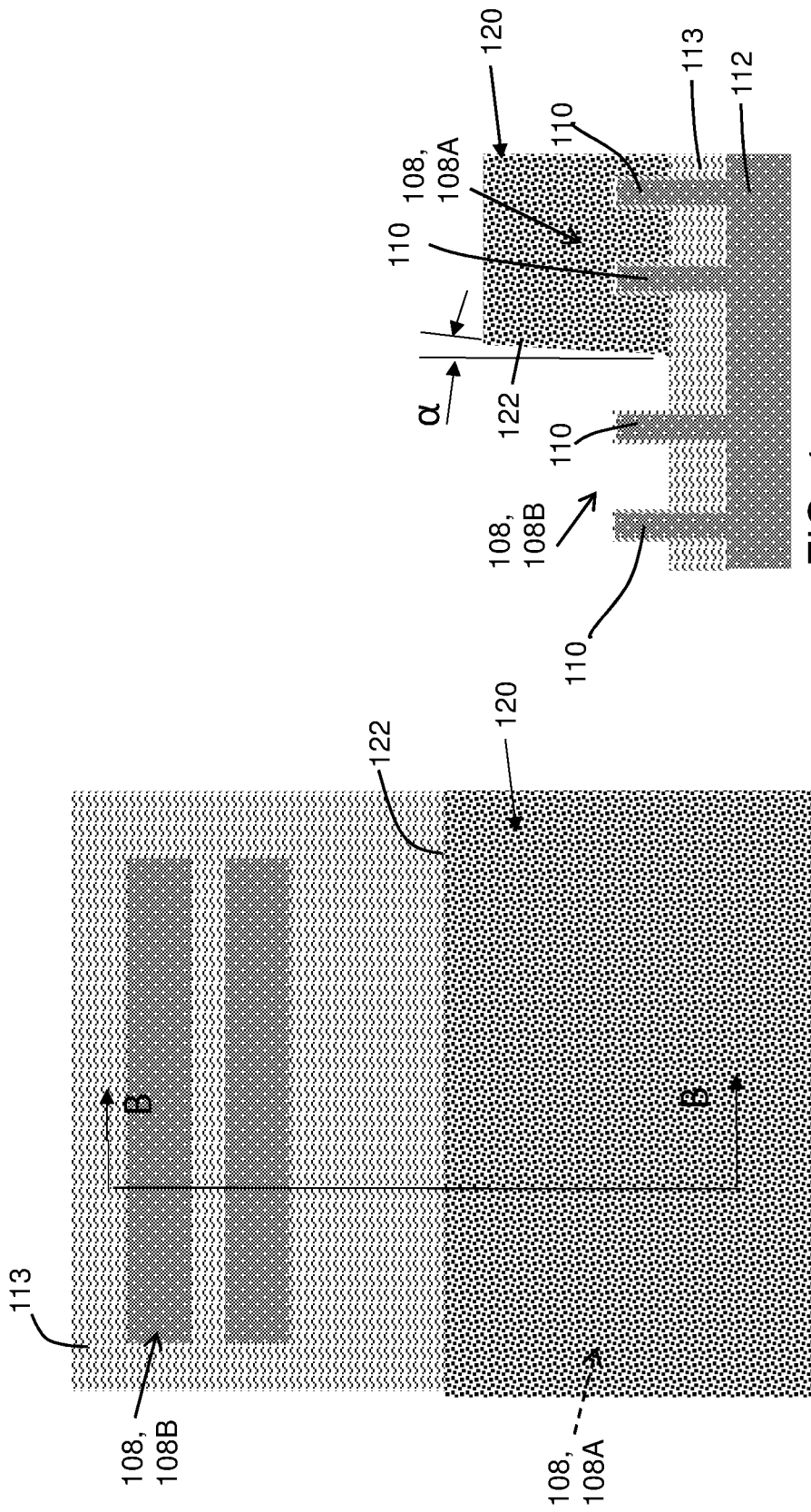

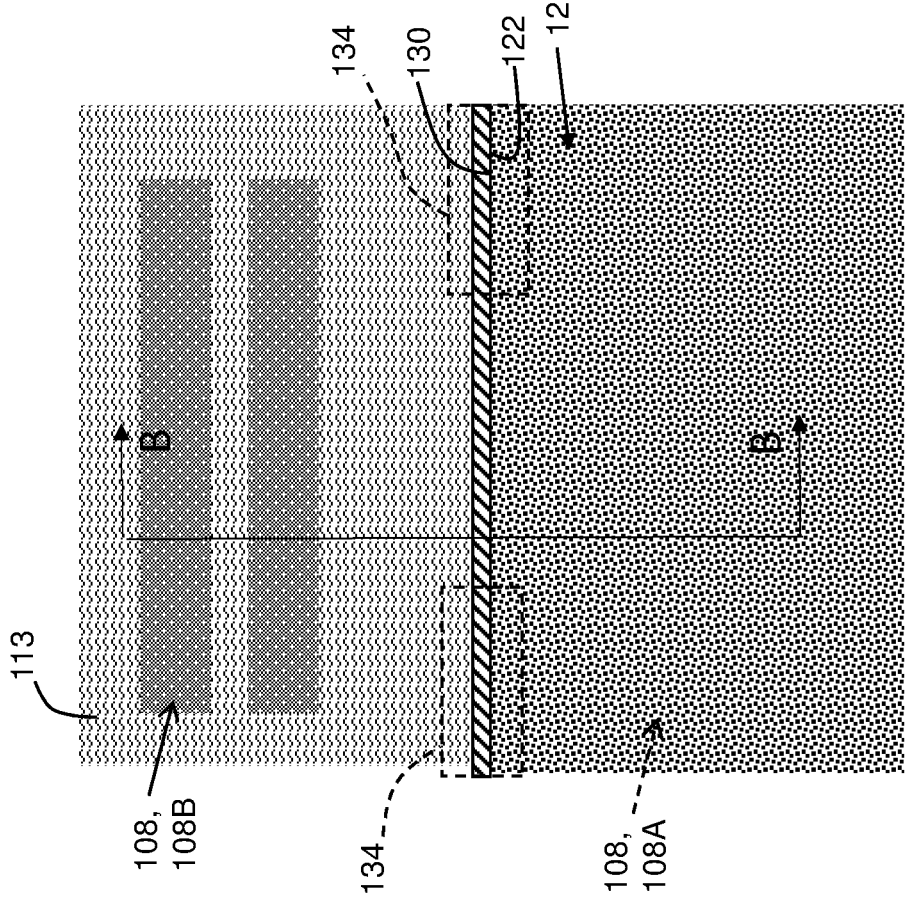
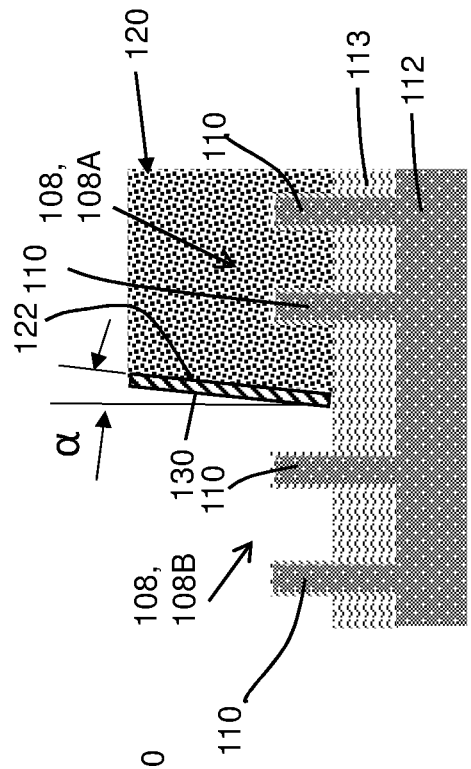
FIG. 5
FIG. 6

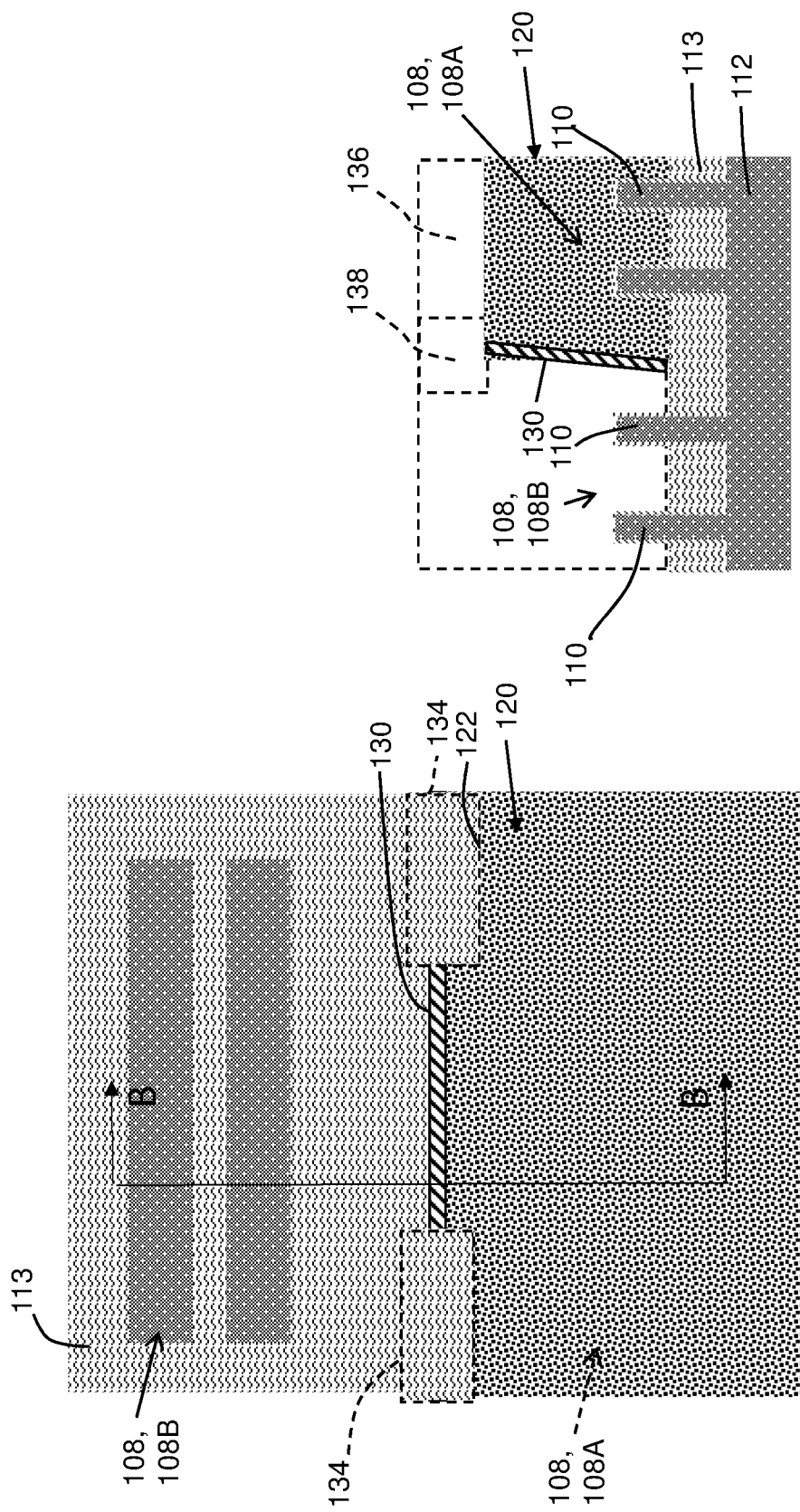

GATE CUT ISOLATION FORMED AS LAYER AGAINST SIDEWALL OF DUMMY GATE MANDREL

BACKGROUND

The present disclosure relates to integrated circuit (IC) fabrication, and more specifically, to a gate cut isolation formed as a layer against a sidewall in a partially formed dummy gate material mandrel, an IC including the same and a method of forming the gate cut isolation.

Advanced manufacturing of ICs requires formation of individual circuit elements, e.g., field-effect-transistors (FETs) and the like, based on specific circuit designs. A FET generally includes source, drain, and gate regions. The gate region is placed between the source and drain regions and controls the current through a channel region (often shaped as a semiconductor fin) between the source and drain regions. Gates may be composed of various metals and often include a work function metal which is chosen to create desired characteristics of the FET. Transistors may be formed over a substrate and may be electrically isolated with an insulating dielectric layer, e.g., inter-level dielectric (ILD) layer. Contacts may be formed to each of the source, drain, and gate regions through the dielectric layer in order to provide electrical connection between the transistors and other circuit elements that may be formed subsequent to the transistor in other metal levels.

Fin-type field effect transistor (finFETs) are formed by creating a number of semiconductor fins on a substrate and placing a gate conductor perpendicularly across the fins. A finFET is created by the gate forming a channel region below the gate in the fin, and source/drain regions formed in the fin aside the gate. In order to form the various portions of the finFET according to replacement metal gate (RMG) approach, an elongated dummy gate is put in place where the metal gate conductor will eventually be placed perpendicularly across the fins. The dummy gate allows for processing such as anneals to be carried out without damaging the final gate conductor material. Spaces between the dummy gates and fins are filled with an interlayer dielectric. The dummy gates are typically made of polysilicon or amorphous silicon with a liner spacer such as titanium nitride. As part of the process, a gate cut opening is formed in the dummy gate, and is then filled with a gate cut fill. To form the finFETs, the dummy gate is removed, and replaced with a metal gate conductor that extends over adjacent fins. The gate cut fill creates a gate cut isolation that provides an electrical isolation between gates of adjacent finFETs to electrically isolate the finFETs.

As integrated circuit (IC) fabrication continues to scale to smaller technology nodes, e.g., 7 nanometers and beyond, spacing between structures continues to decrease. For example, ground rules and pattern variability lead to extremely tight spacing for gate cut openings during finFET formation. A particular challenge with forming the gate cut is creating the opening with the desired size. For example, the width for a gate cut opening is typically about 30 nanometers (nm), which allows sufficient space to remove any residue from the opening. However, that size is becoming too large for 7 nm technology node finFETs. That is, the gate cut fill size needs to be smaller than 30 nm to provide sufficient spacing, and to ensure metal gate conductor separation after metal conductor replacement in a 7 nm technology node. More specifically, in the 7 nm technology node, the amorphous silicon and liner spacer pinch off in a narrow gate cut, making it very difficult to remove the amorphous silicon residue at the bottom of the opening with the conventional reactive ion etch (RIE). In one approach, a high bias power RIE overetch is applied, but this etch creates bowed sidewalls in the gate cut opening, which can create shorts with the gate conductor ends. This approach can also reduce the space between the gate cut isolation and the active region to a level at which the high dielectric metal gate material cannot be formed over the active region next to the gate cut isolation, i.e., formation of a work function metal layer as part of the replacement metal gate process.

SUMMARY

A first aspect of the disclosure is directed to a method, comprising: forming a dummy gate material mandrel having a sidewall positioned between and spaced from a first active region covered by the dummy gate material mandrel and a second active region not covered by the dummy gate material mandrel; forming a gate cut dielectric layer against the sidewall of the dummy gate material mandrel; removing at least one selected portion of the gate cut dielectric layer against the sidewall; depositing a dummy gate material over at least the second active region to create a dummy gate material layer with the dummy gate material mandrel, the dummy gate material layer encasing the remaining gate cut dielectric layer; forming at least one dummy gate from the dummy gate material layer over the remaining gate cut dielectric layer and over the first and second active region; depositing an interlayer dielectric (ILD) about each dummy gate; removing each dummy gate to create a gate cut isolation separating space vacated by each dummy gate into a first gate trench over the first active region and a second gate trench over the second active region; and forming a gate conductor in each gate trench, each gate cut isolation electrically isolating respective first and second portions of the gate conductor.

A second aspect of the disclosure includes a structure comprising: a gate cut isolation between ends of a first gate and a second gate over a substrate, the first and second gates over respective first and second active regions of the substrate, the gate cut isolation having a longitudinal axis that is angled in a non-vertical manner.

A third aspect of the disclosure related to an integrated circuit (IC), comprising a first gate extending perpendicularly over a first active region; a second gate extending perpendicularly over a second active region; and a gate cut isolation separating the first gate from the second gate, the gate cut isolation having a longitudinal axis that is angled in a non-vertical manner.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIG. 3 shows a schematic plan view of forming a dummy gate material mandrel according to embodiments of the disclosure.

FIG. 4 shows a cross-sectional view through line B-B in FIG. 3.

FIG. 5 shows a schematic plan view of forming a gate cut dielectric layer against a sidewall of the dummy gate material mandrel, according to embodiments of the disclosure.

FIG. 6 shows a cross-sectional view through line B-B in FIG. 5.

FIG. 7 shows a schematic plan view of removing portion(s) of the gate cut isolation layer, according to embodiments of the disclosure.

FIG. 8 shows a cross-sectional view through line B-B in FIG. 7.

Figure 2:
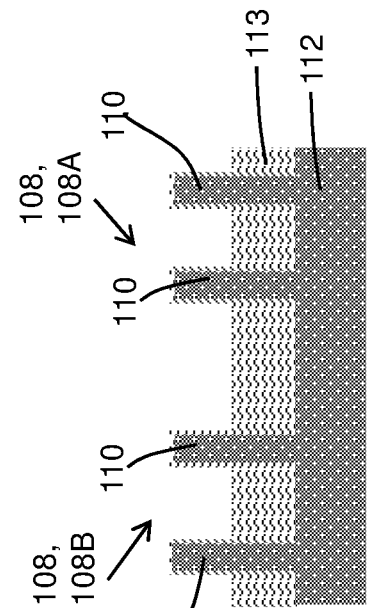
FIG. 2 shows a cross-sectional view of the IC layout of FIG. 1 along line B-B thereof, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

A method of forming a gate cut isolation, and a related structure and integrated circuit (IC) including the gate cut isolation are disclosed. The method forms a dummy gate material mandrel having a sidewall positioned between and spaced from a first active region covered by the mandrel and a second active region not covered by the mandrel. A gate cut dielectric layer is formed against the sidewall of the mandrel. The gate cut dielectric layer may be trimmed to remove it from locations where subsequently formed gates do not require a gate cut isolation. A dummy gate material may be deposited to form a complete dummy gate layer and to encase the gate cut dielectric layer. Subsequent dummy gate formation and replacement metal gate processing forms a gate conductor with the gate cut isolation electrically isolating respective first and second portions of the gate conductor, forming electrically isolated first and second metal gates. The dummy gate formation removes any additional gate cut dielectric layer extending into unnecessary areas. The method creates a very thin, slightly non-vertical gate cut isolation. The method also eliminates the need to define a gate cut critical dimension, or fill a small gate cut opening.

Figure 1:
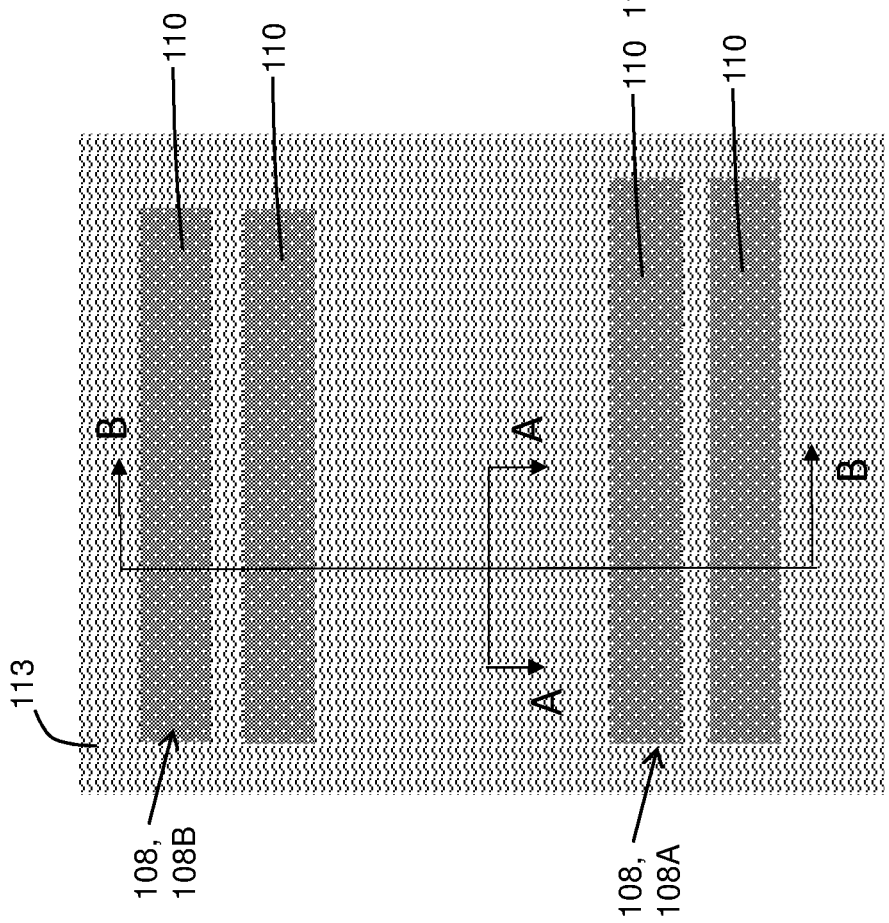
FIG. 1 shows a schematic plan view of an integrated circuit layout indicating cross-sectional views for purposes of description of the disclosure.

FIG. 1 shows a schematic plan view of an integrated circuit (IC) layout indicating cross-sectional views for purposes of description of the disclosure. In FIG. 1, cross-sectional view along line A-A is across a gate direction, and cross-sectional view along line B-B is across an active region direction in FIG. 1. Lines A-A and B-B will be referenced in later drawings as necessary. For example, FIG. 2 shows a cross-sectional view along line B-B in FIG. 1. The disclosure is shown applied to a fin-type active region, but it is emphasized, as one with skill in the art will recognize, that the teachings are applicable to any type active region including but not limited to planar, semiconductor-on-insulator, etc.

With reference to FIGS. 1 and 2, active regions 108 are shown in substrate 112 (FIG. 2). FIG. 1 shows active regions 108 as a solid block; however as noted, they are described herein as including semiconductor fins. In one embodiment, as shown best in FIG. 2, each active region 108 may include one or more of a plurality of semiconductor fins 110, which have been formed extending from substrate 112 (FIG. 2). As shown in FIG. 2, a first active region 108A may include one or more semiconductor fins 110, and a second active region 108B may include one or more semiconductor fins 110. Active regions 108, semiconductor fins 110 and substrate 112 may include but are not limited to silicon, germanium, silicon germanium, silicon carbide, and those consisting essentially of one or more III-V compound semiconductors having a composition defined by the formula $Al_{X1}Ga_{X2}IN_{X3}As_{Y1}P_{Y2}N_{Y3}Sb_{Y4}$, WHERE X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate 112 may be strained. Semiconductor fins 110 may be electrically isolated from each other at a lower end thereof by a shallow isolation trench (STI) dielectric layer 113. As shown in FIG. 2, STI dielectric layer 113 may cover semiconductor fins 110. Active regions 108 as shown in FIGS. 1 and 2 may be formed using any now known or later developed semiconductor process.

STI dielectric layer 113 may electrically isolate portions of active regions 108A, 108B, i.e., a lower portion of semiconductor fins 110. Suitable dielectric materials for STI dielectric layer 113 may include but are not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

FIGS. 3 and 4 show forming a dummy gate material mandrel 120 having a sidewall 122 positioned between and spaced from first active region 108A (buried in FIG. 3) covered by dummy gate material mandrel 120 and a second active region 108B not covered by dummy gate material mandrel 120. FIG. 3 shows a schematic plan view and FIG. 4 shows a cross-sectional view through line B-B in FIG. 3 of the IC layout at this stage. Dummy gate material mandrel 120 may include any now known or later developed dummy gate material such as amorphous silicon (a-Si) or polysilicon. Dummy gate material mandrel 120 (sometimes referenced as "mandrel 120" for brevity) may be formed for example by depositing dummy gate material over active regions 108, and using conventional semiconductor photolithographic processing (e.g., depositing a mask, patterning the mask and etching) to remove the layer from over second active region 108B. That is, forming a patterned mask (not shown) with a pattern to form mandrel 120, and etching to form mandrel 120 with sidewall 122 positioned between and spaced from first and second active regions 108A, 108B, i.e., adjacent semiconductor fins 110 of respective active regions 108A, 108B. As shown in FIG. 4, sidewall 122 is formed at a slight angle α relative to vertical. That is, sidewall 122 is angled in a non-vertical manner. The angle may be, for example, 0.1 to 4° from vertical.

As used herein, "depositing" may include any now known or later developed techniques appropriate for the material to be deposited including but are not limited to, for example: chemical vapor deposition (CVD), low-pressure CVD (LP-CVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. For mandrel 120 with sidewall 122 formation, a RIE may be used, for example.

FIGS. 5 and 6 show forming a gate cut dielectric layer 130 against sidewall 122 of mandrel 120. FIG. 5 shows a schematic plan view and FIG. 6 shows a cross-sectional view through line B-B in FIG. 5 at this stage. Gate cut dielectric layer 130 may include any now known or later developed low dielectric constant (e.g., <3.9) gate cut material such as but not limited to silicon nitride. Gate cut dielectric layer 130 may be formed by depositing the material over mandrel 120 and uncovered active region 108B, e.g., via ALD, and performing an anisotropic etch, e.g., a directional etch for sputter ion depth profiling (SIDP). The anisotropic etch may be directed to remove the layer from horizontal surfaces and desired vertical surfaces, but leave gate cut dielectric layer 130 on sidewall 122. Gate cut dielectric layer 130 is very thin, e.g., it may have a thickness of no greater than 10 nanometers. As illustrated, gate cut dielectric layer 130 is positioned between and spaced from active region 108A, i.e., an innermost semiconductor fin thereof, and second active region 108B, i.e., an innermost semiconductor fin thereof.

FIGS. 7 and 8 show removing at least one selected portion 134 (phantom boxes in FIG. 5, and FIG. 7) of gate cut dielectric layer 130 against sidewall 122. FIG. 7 shows a schematic plan view and FIG. 8 shows a cross-sectional view through line B-B in FIG. 7 at this stage. This process may be carried out, prior to the depositing dummy gate material, as will be described subsequently, to remove gate cut dielectric layer 130 from any location in which a subsequently-formed gate conductor (not shown) is not to include a gate cut isolation. As understood by those with skill in the art, not all gates require gate cut isolations. Hence, gate cut dielectric layer 130, which will eventually be used to form gate cut isolations, may be removed from locations where a gate cut isolation is not desired for a gate that will be formed in that location. This process may be performed using conventional semiconductor processing such as forming a mask 136 (shown in phantom in FIG. 8) exposing (via opening(s) 138 in mask 136) at least one unwanted portion (inside phantom box 134 in FIG. 5) of gate cut dielectric layer 130. In FIG. 8, openings 138 in mask 136 are located into or out of the page, as shown, i.e., line B-B in FIG. 7 does not intersect openings 138 in mask 136. As shown in FIG. 7, etching removes at least one unwanted portion (phantom box 134) of gate dielectric layer 130. As also observed in FIG. 7, mask 136 (FIG. 8) may expose portions of mandrel 120, and the etching may remove the exposed portions of mandrel 120—see stepped remaining mandrel 120 in FIG. 7. The etching used at this stage may include, for example, a RIE. As will be explained further, additional portions of gate cut dielectric layer 130 may be removed during dummy gate formation.

Figure 10:
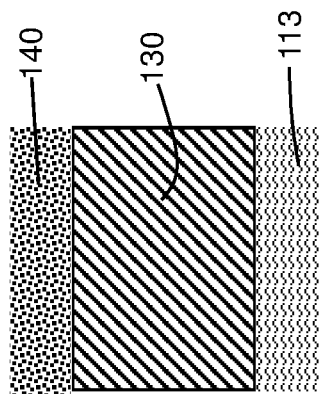
FIG. 10 shows a cross-sectional view through line A-A in FIG. 9.
Figure 11:
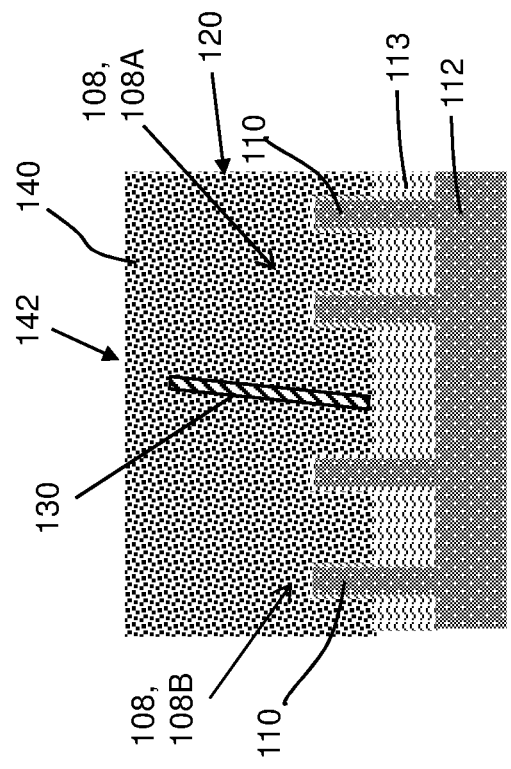
FIG. 11 shows a cross-sectional view through line B-B in FIG. 9.
Figure 9:
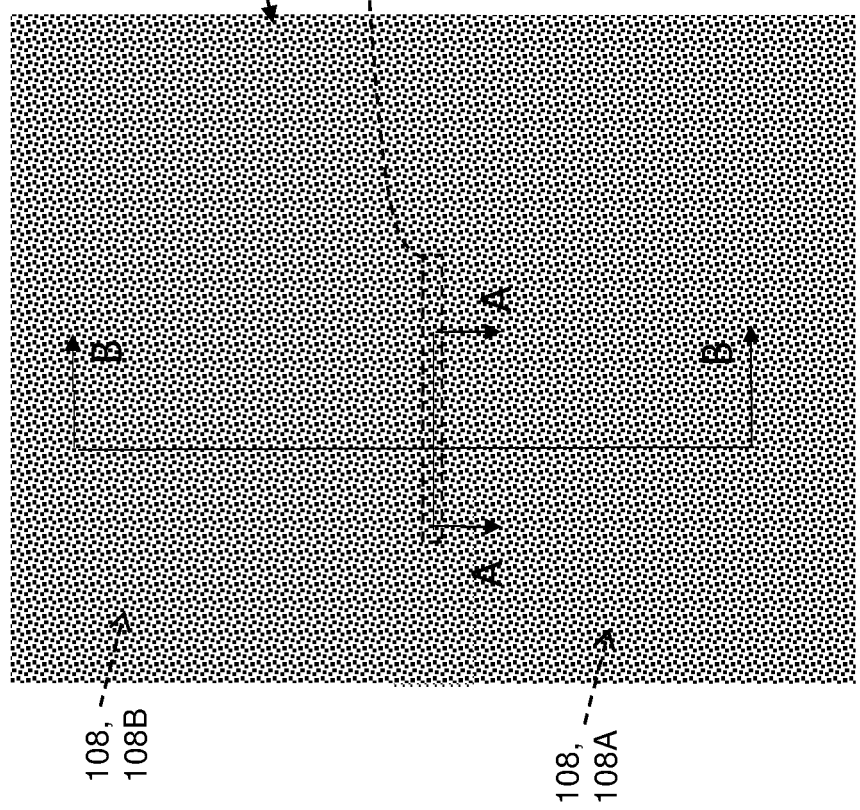
FIG. 9 shows a schematic plan view of forming a dummy gate material layer with the mandrel, according to embodiments of the disclosure.

FIGS. 9, 10 and 11 show depositing a dummy gate material 140. FIG. 9 shows a schematic plan view, FIG. 10 shows a cross-sectional view through line A-A in FIG. 9, and FIG. 11 shows a cross-sectional view through line B-B in FIG. 9 at this stage. Dummy gate material 140 may be deposited over at least second active region 108B to create a dummy gate material layer 142 with dummy gate material mandrel 120. As illustrated best in FIG. 11, dummy gate material layer 142 encases remaining gate cut dielectric layer 130. Dummy gate material 140 may be any of the aforementioned materials used for mandrel 120, e.g., amorphous silicon or polysilicon. Any necessary planarization required may be carried out. For example, a planarization may be carried out to remove excess dummy gate material 140 from over mandrel 120. Planarization refers to various processes that make a surface more planar (that is, more flat and/or smooth). Chemical-mechanical-polishing (CMP) is one currently conventional planarization process which planarizes surfaces with a combination of chemical reactions and mechanical forces.

Figure 15:
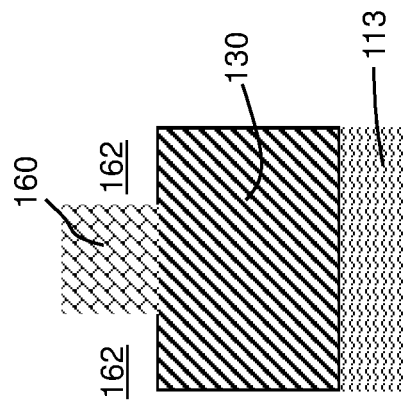
FIG. 15 shows a cross-sectional view through line A-A in FIG. 14.
Figure 16:
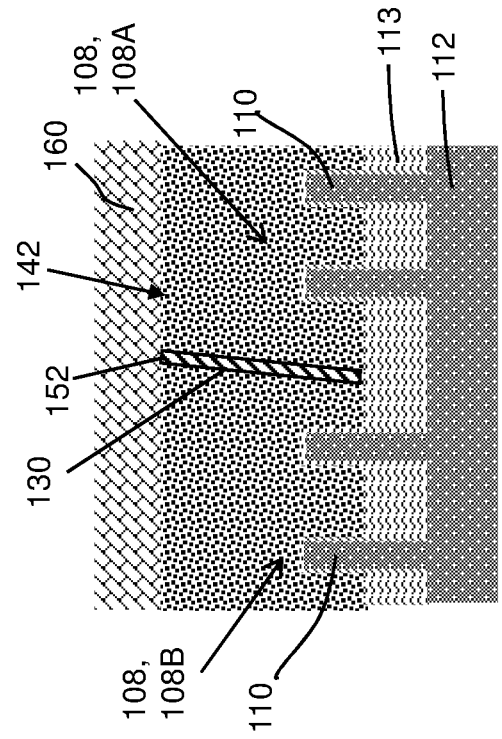
FIG. 16 shows a cross-sectional view through line B-B in FIG. 14.
Figure 18:
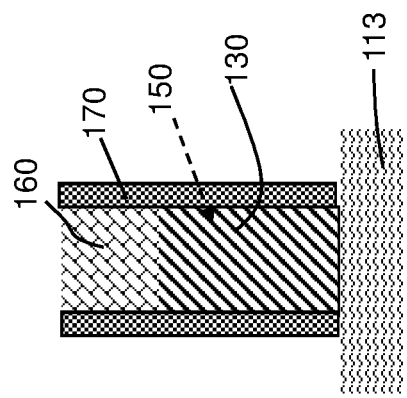
FIG. 18 shows a cross-sectional view through line A-A in FIG. 17.
Figure 19:
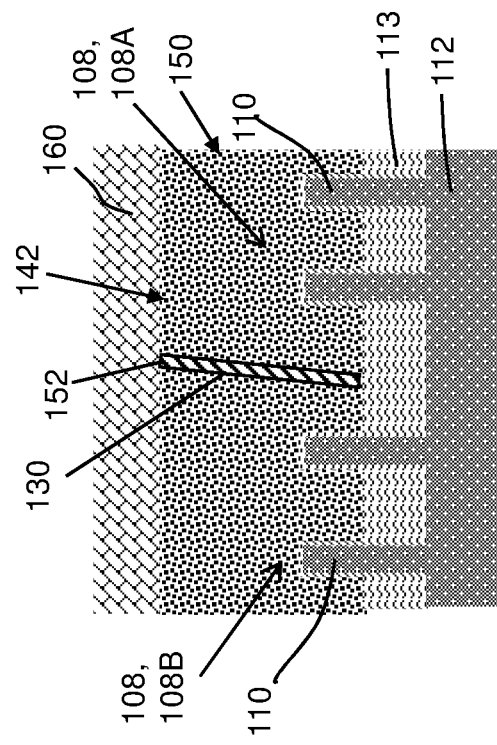
FIG. 19 shows a cross-sectional view through line B-B in FIG. 17.
Figure 17:
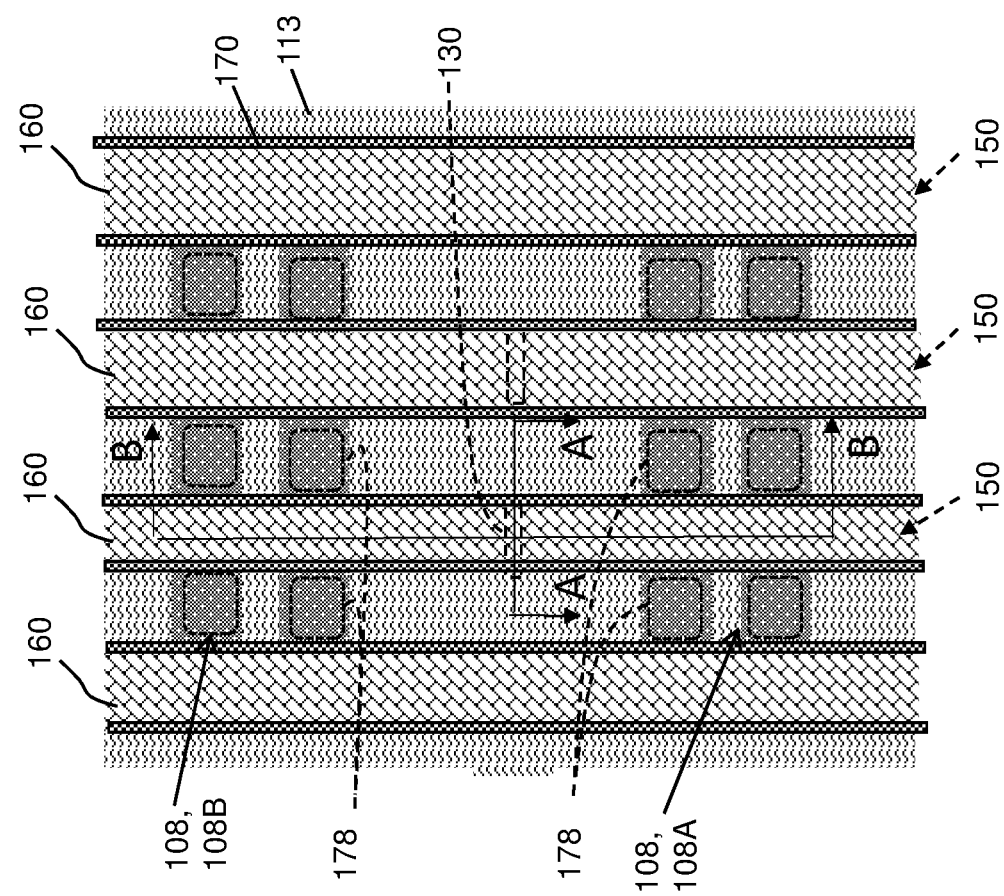
FIG. 17 shows a schematic plan view of forming dummy gate(s), according to embodiments of the disclosure.

FIGS. 12-19 show forming at least one dummy gate 150 (FIGS. 17-19). As will be described, dummy gate(s) 150 are formed from dummy gate material layer 142 over remaining gate cut dielectric layer 130 and over first and second active regions 108A, 108B. Dummy gate(s) 150 may be formed using any now known or later developed process.

Figure 13:
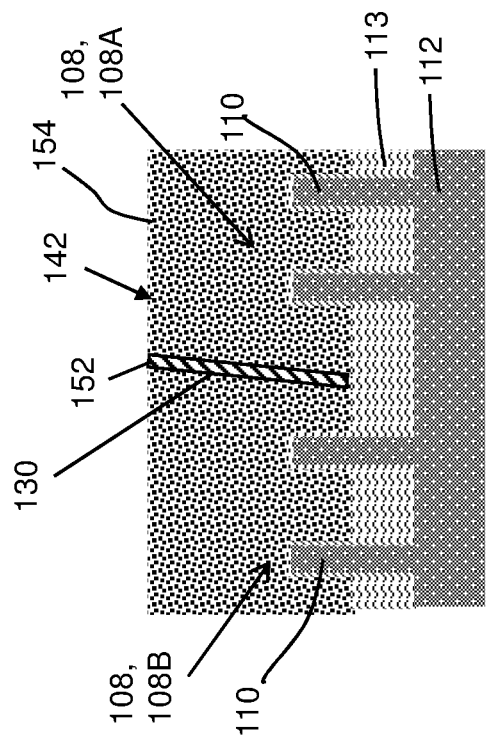
FIG. 13 shows a cross-sectional view through line B-B in FIG. 12.
Figure 12:
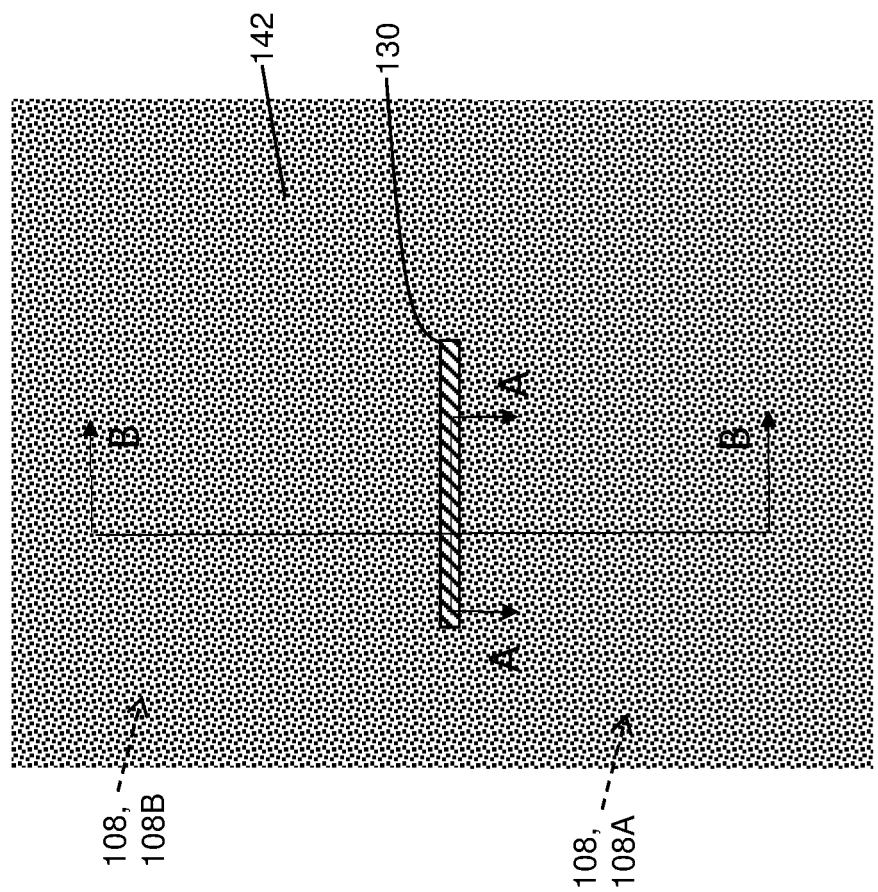
FIG. 12 shows a schematic plan view of planarizing to expose an upper end of the gate cut isolation layer, according to embodiments of the disclosure.

FIGS. 12 and 13 show planarizing to expose an upper end 152 of remaining gate cut dielectric layer 130. FIG. 12 shows a schematic plan view, FIG. 13 shows a cross-sectional view through line B-B in FIG. 12 at this stage. The planarization makes upper end 152 even with an upper surface 154 of dummy gate dielectric layer 142.

Figure 14:
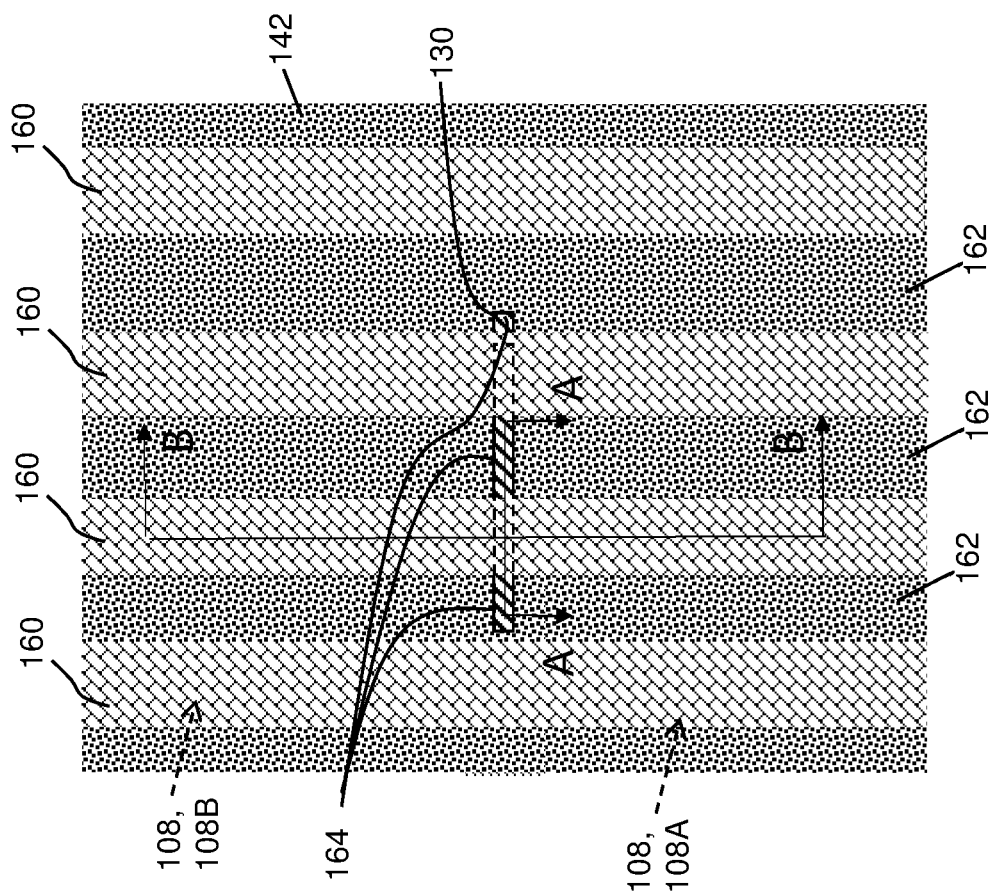
FIG. 14 shows a schematic plan view of forming a dummy gate patterning mask, according to embodiments of the disclosure.

FIGS. 14-16 show forming a patterned mask 160 with a pattern 162 (FIGS. 14 and 15) for dummy gate(s) 150 (FIG. 19). FIG. 14 shows a schematic plan view, FIG. 15 shows a cross-sectional view through line A-A in FIG. 14, and FIG. 16 shows a cross-sectional view through line B-B in FIG. 14 at this stage. Patterned mask 160 may include any now known or later developed hard mask material. Pattern 162 is configured to have openings extending perpendicularly across active regions 108A, 108B, i.e., semiconductor fins 110.

FIGS. 17-19 show etching to form dummy gate(s) 150. The etching may include, for example, a RIE. FIG. 17 shows a schematic plan view, FIG. 18 shows a cross-sectional view through line A-A in FIG. 17, and FIG. 19 shows a cross-sectional view through line B-B in FIG. 17 after the etching. As observed by comparing FIGS. 14 and 17, the etching removes portions 164 (FIG. 14) of gate cut dielectric layer 130 unprotected by patterned mask 160, e.g., portions that extend outside of a desired area for dummy gate 150. Dummy gates(s) 150 extend over active regions 108A, 108B, e.g., perpendicularly over semiconductor fins 110, in the same locations as metal gates are desired. FIGS. 17 and 18 also show forming a liner spacer 170 along each dummy gate 150. Liner spacer 150 may include any now known or later developed liner spacer material such as but not limited to a low dielectric constant material like titanium nitride.

At this stage, source/drain (S/D) regions 178 (FIG. 17) may also be formed in active regions 108A, 108B, e.g., in semiconductor fins 110, to each side of dummy gate 150. S/D regions 178 may be formed using any now known or later developed process, e.g., by ion implantation of dopants, and/or S/D epitaxy, oxide deposition, polishing and anneal. Doping is the process of introducing impurities (dopants) into a semiconductor substrate, or elements formed on the semiconductor substrate, and is often performed with a mask (or previously-formed elements like the dummy gates in place) so that only certain areas of the substrate/fins will be doped. As understood in the art, doping is used to form the source and drain regions of a field effect transistor (FET). Epitaxy means the growth of a semiconductor material on a deposition surface of a semiconductor material, in which the semiconductor material being grown may have the same crystalline characteristics as the semiconductor material of the deposition surface.

Figure 21:
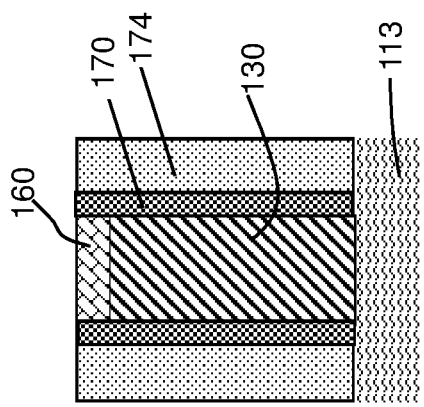
FIG. 21 shows a cross-sectional view through line A-A in FIG. 20.
Figure 20:
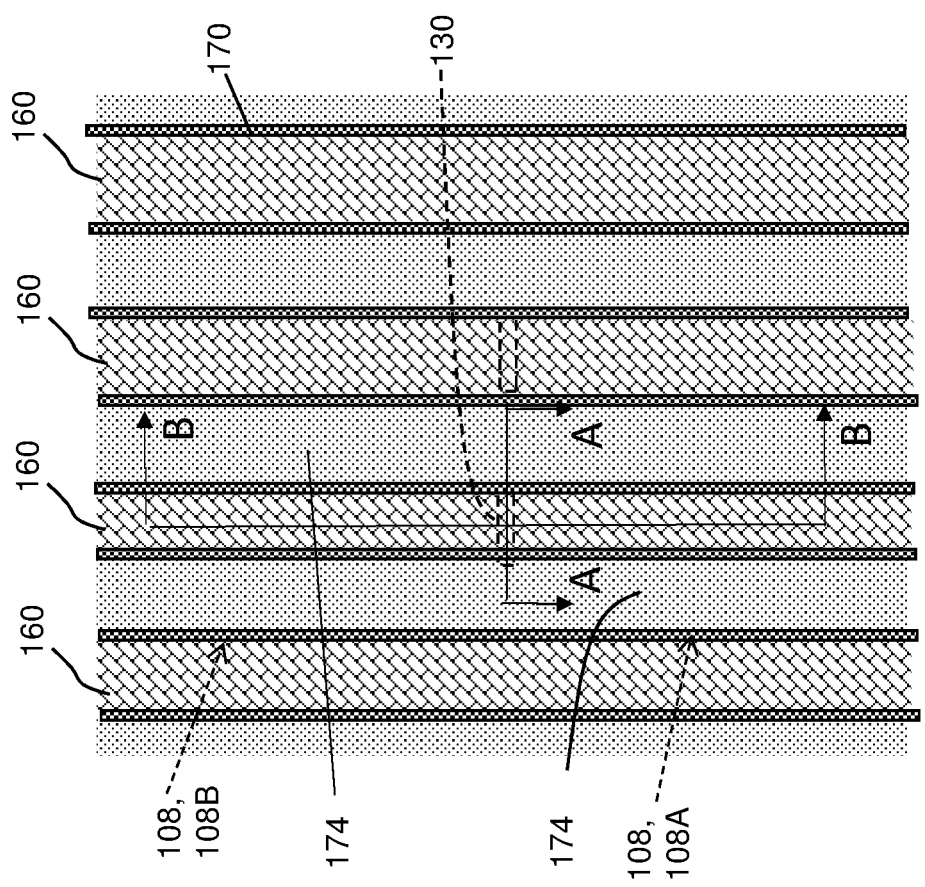
FIG. 20 shows a schematic plan view of depositing an interlayer dielectric, according to embodiments of the disclosure.

FIGS. 20 and 21 show depositing an interlayer dielectric (ILD) 174 about each dummy gate 150 (FIG. 19). FIG. 20 shows a schematic plan view, and FIG. 21 shows a cross-sectional view through line A-A in FIG. 20. ILD 174 may be any of the aforementioned dielectric materials listed for STI dielectric layer 113. A planarization may be performed after ILD deposition to expose mask 160 and liner spacer 170.

Figure 23:
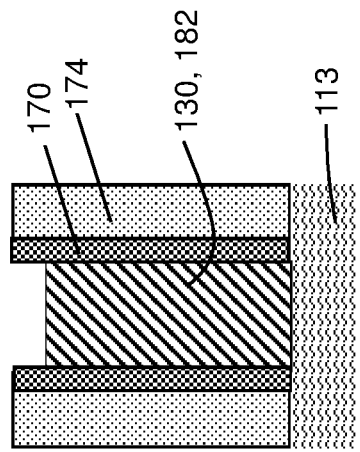
FIG. 23 shows a cross-sectional view through line A-A in FIG. 22.
Figure 24:
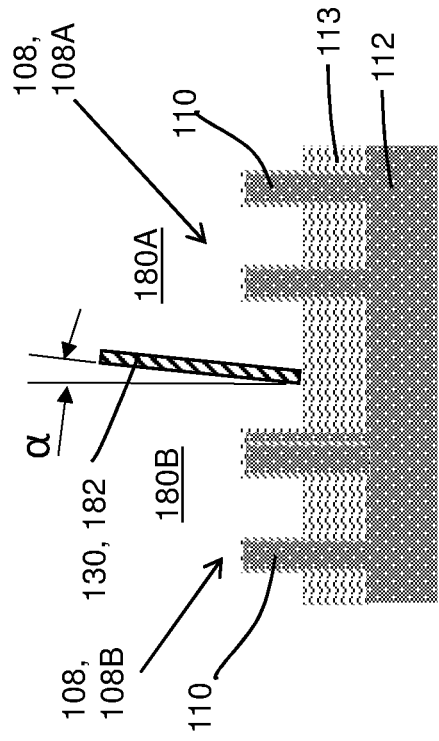
FIG. 24 shows a cross-sectional view through line B-B in FIG. 22.
Figure 22:
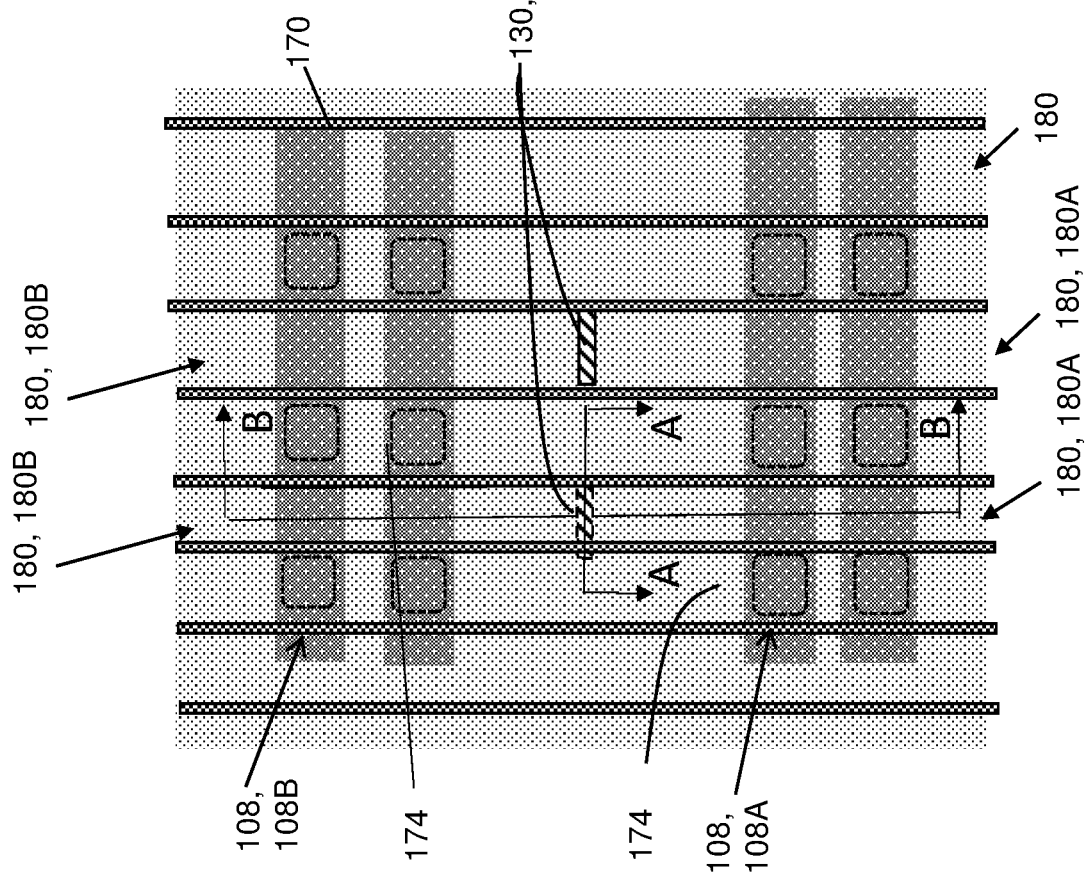
FIG. 22 shows a schematic plan view of removing dummy gate(s) (dummy gate pull), according to embodiments of the disclosure.

FIGS. 22-27 show a replacement metal gate (RMG) process. FIGS. 22-24 show removing each dummy gate 150 to create a gate cut isolation 182 separating space vacated by each dummy gate 150 into a first gate trench 180A over first active region 108A and a second gate trench 180B over second active region 108B. That is, each dummy gate 150 is removed to form a gate trench 180 (two shown: 180A, 180B), leaving remaining gate cut isolation layer 130 therein to create a gate cut isolation 182. FIG. 22 shows a schematic plan view, FIG. 23 shows a cross-sectional view through line A-A in FIG. 22, and FIG. 24 shows a cross-sectional view through line B-B in FIG. 22 at this stage. This step is commonly called "dummy gate pull." Dummy gate(s) 150 may be removed using any now known or later developed process. In one example, dummy gate(s) 150 are etched away. In this case, etching removes dummy gate layer 142 (FIG. 19) from within ILD 174, for example, by RIE using any necessary masking. It is understood that dummy gate 150 removal leaves gate trenches 180A, 180B (FIG. 24) in ILD 174 on opposing sides of gate cut isolation 182—viewable in the B-B cross-section of FIG. 24, but not the A-A cross-section of FIG. 23. As understood, gate trench 180A is over first active region 108A, and gate trench 180B is over second active region 108B. This step may also include etching to remove a remaining portion of mask 160, e.g., over gate cut dielectric layer 130 (FIG. 23). As shown in FIG. 22, other gate trenches 180 may also be formed where no gate cut isolation is being created.

As shown in FIG. 24, gate cut isolation 182 has a longitudinal axis that is angled in a non-vertical manner. That is, gate cut isolation 182 (just as sidewall 122 (FIG. 4) and gate cut dielectric layer 130 that is used to form gate cut isolation 182) is formed with a longitudinal axis extending generally through a center of gate cut isolation 182 that is at a slight angle α relative to vertical. As used here, "longitudinal" relates to a lengthwise direction extending from substrate 112, i.e., not in a top-down view. Further, as used here, "vertical" indicates perpendicularly away from an upper surface of substrate 112. It is noted that the angle is not just of an outside surface of the structure, but along an entire central length of the isolation. So, gate cut isolation 182 is angled along a central length (axis) thereof from perpendicular relative to an upper surface of substrate 112. The angle may be, for example, 0.1 to 4° from vertical, i.e., perpendicular to substrate 112. Gate cut isolation 182 has a thickness of no greater than 10 nanometers.

Figure 26:
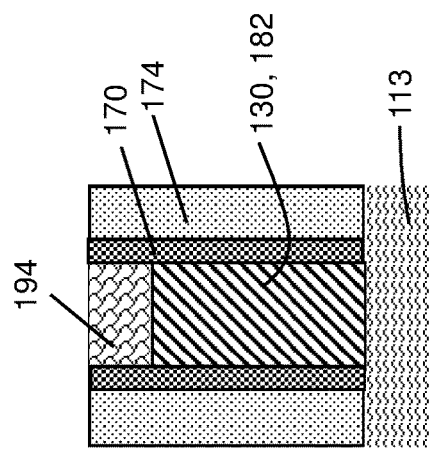
FIG. 26 shows a cross-sectional view through line A-A in FIG. 25.
Figure 27:
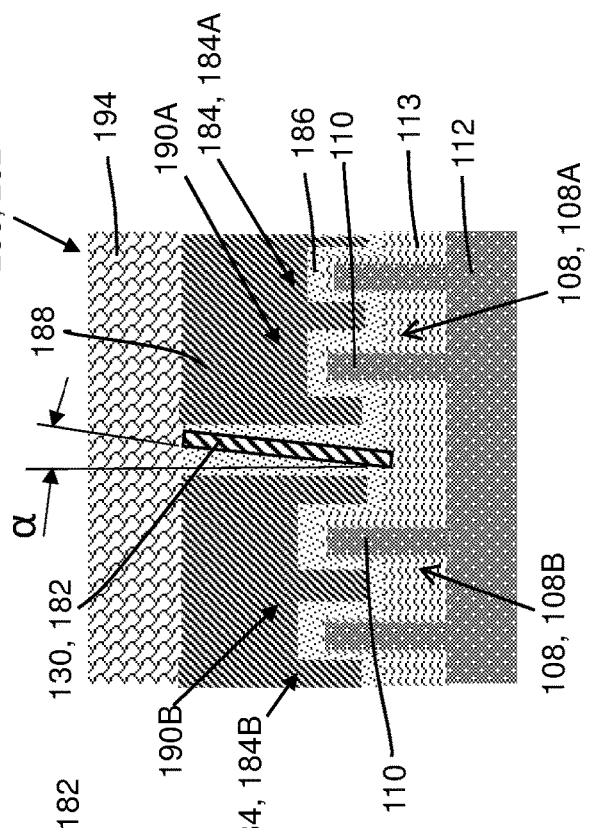
FIG. 27 shows a cross-sectional view through line B-B in FIG. 25.
Figure 25:
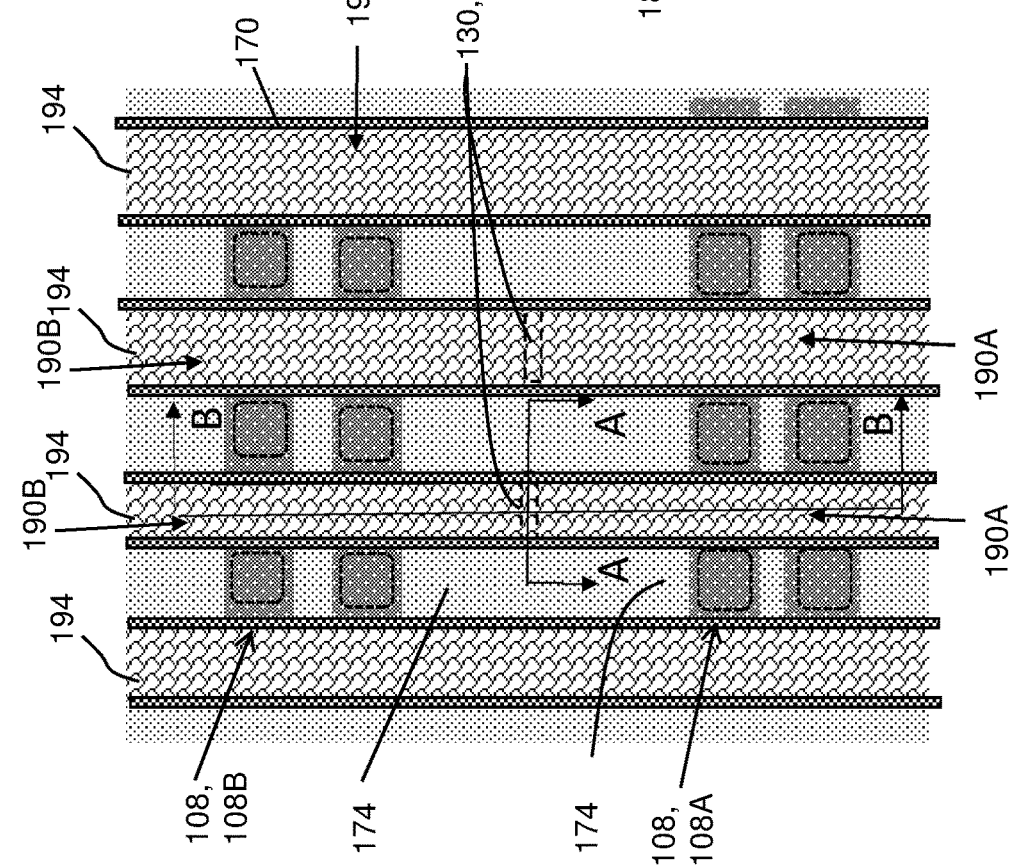
FIG. 25 shows a schematic plan view of forming a gate conductor, a gate structure and an IC, according to embodiments of the disclosure.

FIGS. 25-27 shows forming a gate conductor 184 in each gate trench 180A, 180B (FIG. 24), forming gates 190 (FIGS. 25 and 27). FIG. 25 shows a schematic plan view, FIG. 26 shows a cross-sectional view through line A-A in FIG. 25, and FIG. 27 shows a cross-sectional view through line B-B in FIG. 25 at this stage. Gate conductor 184 may include any now known or later developed gate conductor material. For example, gate conductor 184 may include, as shown in FIG. 17, a work function metal 186 and a metal gate material 188. Metal gates 190A, 190B thus formed have gate conductors with ends thereof against gate cut isolation 182. Work function metal 186 is selected to create a PFET or NFET. Work function metals may include, for example, aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), aluminum-doped titanium carbide (TiAlC), titanium aluminide (TiAl), tungsten (W), tungsten nitride (WN), tungsten carbide (WC), polycrystalline silicon (poly-Si), and/or combinations thereof. Metal gate material 188 may include any now known or later developed gate metal such as but not limited to tungsten (W). One or more planarization(s) may be performed to remove excess work function metal 186 or metal gate material 188. FIGS. 25-27 also show conventional gate recessing and formation of a dielectric cap 194. Dielectric cap 194 may include any now known or later developed cap material, e.g., silicon nitride, silicon oxide, etc.

As shown in FIGS. 25 and 27, each gate cut isolation 182 electrically isolates respective first and second portions 184A, 184B of gate conductor 184. As shown in FIG. 27, portions 184A, 184B form separate gates 190A, 190B over respective first and second active regions 108A, 108B. Gate cut isolation 182 is positioned between and spaced from active region 108A, i.e., a semiconductor fin 110 thereof, and second active region 108B, i.e., a semiconductor fin 110 thereof. Gate cut isolation 182 is very thin, e.g., it may have a thickness of no greater than 10 nanometers.

FIG. 27 shows a structure 200 and an IC 202 including a gate cut isolation 182 according to embodiments of the disclosure. Structure 200 and IC 202 include first gate 190A extending perpendicularly over a first active region 108A, and second gate 190B extending perpendicularly over second active region 108B. Gate cut isolation 182 electrically separates first gate 190A from second gate 190B. More particularly, gate cut isolation 182 is between ends of first gate 190A and second gate 190B over substrate 112. Gate cut isolation 182 is positioned between and spaced from active region 108A, i.e., at least one first semiconductor fin 110 thereof, and active region 108B, i.e., at least one second semiconductor fin 110 thereof. As noted, first and second gates 190A, 190B are over respective first and second active regions 108A, 108B of substrate 112, e.g., semiconductor fins 110 creating channel regions of a transistor thereunder. Gate cut isolation 182 has a longitudinal axis that is angled in a non-vertical manner, e.g., at an angle α of 0.1-4° relative to vertical. Gate cut isolation 182 has a thickness of no greater than 10 nanometers.

Embodiments of the disclosure provide a very thin, slightly non-vertical gate cut isolation. Since the gate cut isolation is formed prior to a dummy gate material layer that forms dummy gates, the method eliminates the need to define a gate cut critical dimension in the dummy gate material. Further, the method eliminates the need to fill a small gate cut opening with gate cut isolation material, which is oftentimes nearly impossible at current advanced technology nodes, e.g., 7 nm.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method, comprising:
   forming a dummy gate material mandrel having a sidewall positioned between and spaced from a first active region covered by the dummy gate material mandrel and a second active region not covered by the dummy gate material mandrel;
   forming a gate cut dielectric layer against the sidewall of the dummy gate material mandrel;
   removing at least one selected portion of the gate cut dielectric layer against the sidewall;
   depositing a dummy gate material over at least the second active region to create a dummy gate material layer with the dummy gate material mandrel, the dummy gate material layer encasing the remaining gate cut dielectric layer;
   forming at least one dummy gate from the dummy gate material layer over the remaining gate cut dielectric layer and over the first and second active region;
   depositing an interlayer dielectric (ILD) about each dummy gate;
   removing each dummy gate to create a gate cut isolation separating space vacated by each dummy gate into a first gate trench over the first active region and a second gate trench over the second active region; and
   forming a gate conductor in each gate trench, the gate cut isolation electrically isolating respective first and second portions of the gate conductor.

2. The method of claim 1, wherein the removing the at least one selected portion of the gate dielectric layer includes, prior to the depositing the dummy gate material:
   forming a mask exposing at least one unwanted portion of the gate cut dielectric layer; and
   etching to remove the at least one unwanted portion of the gate dielectric layer.

3. The method of claim 2, wherein the mask exposes portions of the dummy gate material mandrel, and the etching removes the exposed portions of the dummy gate material mandrel.

4. The method of claim 1, wherein the removing the at least one selected portion of the gate cut dielectric layer against the sidewall removes the gate cut dielectric layer from any location in which a subsequently-formed gate conductor is not to include the gate cut isolation.

5. The method of claim 1, wherein the forming the at least one dummy gate from the dummy gate material layer over the remaining gate cut dielectric layer includes:
   planarizing to expose an upper end of the remaining gate cut dielectric layer;
   forming a patterned mask with a pattern for the at least one dummy gate; and
   etching to form the at least one dummy gate, the etching removing portions of the gate cut dielectric layer unprotected by the patterned mask.

6. The method of claim 5, further comprising forming a liner spacer along each dummy gate.

7. The method of claim 1, wherein the forming the dummy gate material mandrel includes:
   depositing dummy gate material over the plurality of spaced semiconductor fins;
   forming a patterned mask with a pattern to form the dummy gate material mandrel; and
   etching to form the dummy gate material mandrel with the sidewall positioned between and spaced from the first active region and the second active region.

8. The method of claim 1, wherein the first active region includes at least one first semiconductor fin, and the second active region includes at least one second semiconductor fin, and the sidewall is positioned between and spaced from the at least one first semiconductor fin and the at least one second semiconductor fin.

9. The method of claim 1, wherein the forming the dummy gate material mandrel includes the sidewall angled in a non-vertical manner, and the gate cut isolation has a longitudinal axis that is angled in the non-vertical manner.

10. The method of claim 9, wherein the gate cut isolation has a thickness of no greater than 10 nanometers.

11. The method of claim 1, further comprising forming source/drain regions in the first and second active regions prior to the depositing the ILD.

12. A structure comprising:
    a gate cut isolation formed on a shallow isolation trench (STI) dielectric layer disposed over a substrate, the gate cut isolation positioned between ends of a first gate and a second gate over the substrate,
    wherein the first and second gates are formed over respective first and second active regions of the substrate, and
    wherein the gate cut isolation has a longitudinal axis that is angled in a non-vertical manner.

13. The structure of claim 12, wherein the gate cut isolation has a thickness of no greater than 10 nanometers.

14. The structure of claim 12, wherein the first active region includes at least one first semiconductor fin, and the second active region includes at least one second semiconductor fin, and the gate cut isolation is positioned between and spaced from the at least one first semiconductor fin and the at least one second semiconductor fin.

15. An integrated circuit (IC), comprising:
    a substrate;
    a shallow isolation trench (STI) dielectric layer disposed over the substrate;
    a first gate extending perpendicularly over a first active region of the substrate;
    a second gate extending perpendicularly over a second active region of the substrate; and
    a gate cut isolation formed on the STI dielectric layer and separating the first gate from the second gate, the gate cut isolation having a longitudinal axis that is angled in a non-vertical manner.

16. The IC of claim 15, wherein the gate cut isolation has a thickness of no greater than 10 nanometers.

17. The IC of claim 15, wherein the first active region includes at least one first semiconductor fin, and the second active region includes at least one second semiconductor fin, and the gate cut isolation is positioned between and spaced from the at least one first semiconductor fin and the at least one second semiconductor fin.

* * * * *